(12) United States Patent
Tsai et al.

(10) Patent No.: US 10,424,508 B2
(45) Date of Patent: Sep. 24, 2019

(54) INTERCONNECTION STRUCTURE HAVING A VIA STRUCTURE AND FABRICATION THEREOF

(71) Applicant: Delta Electronics, Inc., Taoyuan (TW)

(72) Inventors: Hsin-Chang Tsai, Taoyuan (TW); Peng-Hsin Lee, Taoyuan (TW)

(73) Assignee: Delta Electronics, inc., Taoyuan Hsien (TW)

( * ) Notice: Subject to any disclaimer, the term of this patent is extended or adjusted under 35 U.S.C. 154(b) by 0 days.

(21) Appl. No.: 14/748,811

(22) Filed: Jun. 24, 2015

(65) Prior Publication Data

US 2015/0294910 A1     Oct. 15, 2015

Related U.S. Application Data

(62) Division of application No. 13/675,297, filed on Nov. 13, 2012, now Pat. No. 9,159,699.

(51) Int. Cl.
*H01L 21/768* (2006.01)
*H01L 21/288* (2006.01)
(Continued)

(52) U.S. Cl.
CPC ...... *H01L 21/76898* (2013.01); *H01L 21/268* (2013.01); *H01L 21/2885* (2013.01); *H01L 21/76834* (2013.01); *H01L 21/76879* (2013.01); *H01L 21/76895* (2013.01); *H01L 23/481* (2013.01); *H01L 23/49562* (2013.01); *H01L 23/49575* (2013.01); *H01L 24/05* (2013.01); *H01L 24/91* (2013.01); *H01L 25/074* (2013.01); *H01L 25/18* (2013.01); *H01L 25/50* (2013.01); *H01L 24/03* (2013.01); *H01L 24/13* (2013.01); *H01L 24/16* (2013.01); *H01L 24/81* (2013.01); *H01L 2224/02372* (2013.01); *H01L 2224/0332* (2013.01); *H01L 2224/0401* (2013.01); *H01L 2224/05009* (2013.01);
(Continued)

(58) Field of Classification Search
CPC ............. H01L 21/76898; H01L 23/481; H01L 2224/131; H01L 2924/14; H01L 2224/73204; H01L 2225/06541; H01L 2924/01047; H01L 2224/0557; H01L 2224/13022; H01L 2224/13024; H01L 23/5384; H01L 21/76831
USPC ................................................. 257/734–781
See application file for complete search history.

(56) References Cited

U.S. PATENT DOCUMENTS 6,620,731 B1   9/2003   Farnworth
7,312,400 B2   12/2007   Ito et al.
(Continued)

FOREIGN PATENT DOCUMENTS

JP     2004-128177 A    4/2004
WO   WO 2012/090901 A1   7/2012

*Primary Examiner* — Herve-Louis Y Assouman
(74) *Attorney, Agent, or Firm* — Muncy, Geissler, Olds & Lowe, P.C.

(57) ABSTRACT

A method of forming an interconnection structure is disclosed, including providing a substrate having a first side and a second side opposite to the first side, forming a via hole through the substrate, wherein the via hole has a first opening in the first side and a second opening in the second side, forming a first pad covering the first opening, and forming a via structure in the via hole subsequent to forming the first pad, wherein the via structure includes a conductive material and is adjoined to the first pad.

12 Claims, 14 Drawing Sheets

(51) Int. Cl.
*H01L 23/495* (2006.01)
*H01L 23/48* (2006.01)
*H01L 23/00* (2006.01)
*H01L 25/07* (2006.01)
*H01L 25/18* (2006.01)
*H01L 25/00* (2006.01)
*H01L 21/268* (2006.01)

(52) U.S. Cl.
CPC .............. *H01L 2224/0557* (2013.01); *H01L 2224/05147* (2013.01); *H01L 2224/05548* (2013.01); *H01L 2224/05557* (2013.01); *H01L 2224/06181* (2013.01); *H01L 2224/131* (2013.01); *H01L 2224/13024* (2013.01); *H01L 2224/13147* (2013.01); *H01L 2224/16146* (2013.01); *H01L 2224/16147* (2013.01); *H01L 2224/16148* (2013.01); *H01L 2224/16238* (2013.01); *H01L 2224/17181* (2013.01); *H01L 2224/73221* (2013.01); *H01L 2224/73255* (2013.01); *H01L 2224/73257* (2013.01); *H01L 2224/81193* (2013.01); *H01L 2224/81815* (2013.01); *H01L 2924/00014* (2013.01); *H01L 2924/12042* (2013.01); *H01L 2924/13064* (2013.01)

(56) References Cited

U.S. PATENT DOCUMENTS

| | | | |
|---|---|---|---|
| 7,528,475 | B2 | 5/2009 | Go et al. |
| 7,772,116 | B2 | 8/2010 | Akram et al. |
| 7,843,072 | B1 | 11/2010 | Park et al. |
| 8,575,760 | B2 | 11/2013 | Phee et al. |
| 2004/0043615 | A1* | 3/2004 | Yamamoto ........ H01L 21/76898 438/689 |
| 2004/0064942 | A1* | 4/2004 | Chung ................ H05K 3/3436 29/840 |
| 2004/0080023 | A1 | 4/2004 | Ueda et al. |
| 2004/0203224 | A1* | 10/2004 | Halahan ............ H01L 21/76843 438/637 |
| 2005/0127478 | A1* | 6/2005 | Hiatt .................... H01L 21/6835 257/621 |
| 2005/0205997 | A1* | 9/2005 | Yamamoto ........ H01L 21/76898 257/751 |
| 2005/0275049 | A1* | 12/2005 | Kirby ................ H01L 21/76898 257/433 |
| 2006/0097357 | A1* | 5/2006 | Nemoto .............. H01L 21/6835 257/621 |
| 2006/0186441 | A1 | 8/2006 | Takayama et al. |
| 2006/0226415 | A1 | 10/2006 | Nishijima et al. |
| 2007/0027699 | A1 | 2/2007 | Golding et al. |
| 2007/0194436 | A1 | 8/2007 | Kao et al. |
| 2007/0272940 | A1* | 11/2007 | Lee ....................... H01L 33/486 257/99 |
| 2010/0218818 | A1 | 9/2010 | Kang et al. |
| 2010/0244247 | A1* | 9/2010 | Chang ............... H01L 21/76898 257/741 |
| 2011/0101399 | A1 | 5/2011 | Suehiro et al. |
| 2011/0174533 | A1 | 7/2011 | Nagano |
| 2011/0175142 | A1 | 7/2011 | Tsurumi et al. |
| 2012/0126419 | A1* | 5/2012 | Kripesh .................. H01L 24/11 257/774 |
| 2012/0220123 | A1* | 8/2012 | Nakayama ............ H01L 21/486 438/667 |
| 2012/0228780 | A1* | 9/2012 | Kim ....................... H01L 23/36 257/774 |
| 2012/0313207 | A1* | 12/2012 | Oganesian ............. H01L 24/19 257/433 |
| 2013/0272648 | A1 | 10/2013 | Terada et al. |

* cited by examiner

INTERCONNECTION STRUCTURE HAVING A VIA STRUCTURE AND FABRICATION THEREOF

CROSS REFERENCE TO RELATED APPLICATION

This application is a Divisional of pending U.S. patent application Ser. No. 13/675,297, filed Nov. 13, 2012 and entitled "INTERCONNECTION STRUCTURE HAVING A VIA STRUCTURE".

BACKGROUND OF THE INVENTION

Field of the Invention

This invention relates generally to semiconductor manufacturing, and specifically, to a method for fabricating semiconductor components and interconnects with contacts on opposing sides.

Description of the Related Art

Semiconductor components include external contacts that allow electrical connections to be made from the outside to the integrated circuits contained in the semiconductor components. A semiconductor die, for example, includes patterns of bond pads formed on the face of the die. Semiconductor packages, such as chip scale packages, also include external contacts. Typically, a component includes only one set of external contacts on either the face side (circuit side) or the back side of the component. However, it is sometimes necessary for a component to have external contacts on both sides.

In semiconductor technology, a through-silicon via, also known as a through-substrate via, is a conductive feature formed in a semiconductor substrate (wafer or die) to electrically connect external contacts from both sides. The TSV feature vertically passes through the semiconductor substrate, providing for stacked wafer/die packaging methods and allowing for electrical connection between circuits within separate wafers or chips. There are a number of ways to create a TSV. Typically, a hole is etched into the semiconductor substrate, and sometimes through the interconnect structure as well. The hole may then be lined with various isolating layers and/or various metal layers. The hole is then filled with a conductive material, typically copper (Cu), which becomes the major part of a TSV.

In traditional technologies, an electrode electroplating method is used for the conducive filling materials to be disposed in the hole of the through silicon via (TSV), wherein a seeding layer is formed by a vacuum technique, such as plasma vapor deposition, prior to formation of the conductive filling material. The vacuum technique requires high priced equipment, which increases device costs.

BRIEF SUMMARY OF INVENTION

The invention provides an interconnection structure. A substrate has at least one electric device formed adjacent to a first side of the substrate and a via hole formed therethrough. A via structure is disposed in the via hole having a first side neighboring the first side of the substrate, wherein the via structure does not exceed the first side of the via hole. A first pad is disposed on the first side of the substrate and covering the via hole, wherein the first pad is adjoined to the via structure and electrically connects with the at least one electric device.

The invention provides a method of forming an interconnection structure, comprising providing a substrate having a first side and a second side opposite to the first side, forming a via hole through the substrate, wherein the via hole has a first opening in the first side and a second opening in the second side, forming a first pad covering the first opening, and forming a via structure in the via hole subsequent to forming the first pad, wherein the via structure comprises a conductive material and is adjoined to the first pad.

The invention provides a method for forming an interconnection structure, comprising providing a substrate, forming a via hole through the substrate, and performing a screen printing process on the first side of the substrate to fill a conductive material into the via hole so as to form a via structure in the via hole and a first pad disposed on a first side of the substrate, adjoined to the via structure.

BRIEF DESCRIPTION OF DRAWINGS

The invention can be more fully understood by reading the subsequent detailed description and examples with references made to the accompanying drawings, wherein.

DETAILED DESCRIPTION OF INVENTION

Figure 1A:
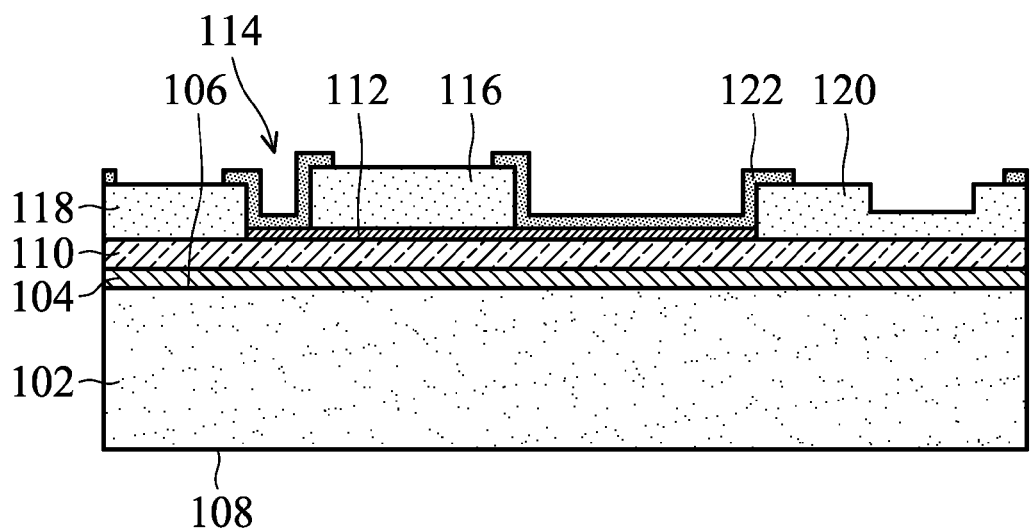
FIG. 1A to FIG. 1F show intermediate stages of cross sections of a method for forming the interconnect structure of an embodiment of the invention.

It is understood that specific embodiments are provided as examples to teach the broader inventive concept, and one of ordinary skill in the art can easily apply the teaching of the present disclosure to other methods or apparatus. The following discussion is only used to illustrate the invention, not limit the invention.

A method for forming the interconnect structure of an embodiment of the invention is illustrated in accordance with FIG. 1A to FIG. 1F. First, referring to FIG. 1A, a substrate 102 comprising a first side 106 and a second side 108 opposite to the first side 106 is provided. The substrate 102 can be any suitable semiconductor material. For example, the substrate 102 can be Si, SiC, Ge, SiGe, GaAs, InAs, InP or GaN. Next, a buffer layer 104 is formed on the substrate 102. In an embodiment of the invention, the buffer layer 104 can be a nitride based material to provide good adhesion for the layers thereon and also solve issues of lattice mismatch, but the invention is not limited thereto. The buffer layer 104 can be formed of any suitable material. In an embodiment of the invention, the buffer layer 104 can be aluminum nitride. A first channel layer 110 and a second channel layer 112 are formed on the buffer layer 104. In an embodiment, the first channel layer 110 can be GaN and the second channel layer 112 can be AlGaN. Thereafter, a first metal layer (not shown) is formed on the first channel layer 110 and is then patterned by lithography and etching to form a source electrode 118 and a drain electrode 120. In an embodiment of the invention, the first metal layer is a stack of Ti, Al, Ni and/or Au layers. Furthermore, a rapid thermal annealing (RTA) process can be performed to the first metal layer. A second metal layer (not shown) is deposited on the first channel layer 110 and then patterned by lithography and etching to form a gate electrode 116. Next, a passivation layer 122, such as silicon nitride and silicon oxide, is formed to protect the device thereunder. The first channel layer 110, the second channel layer 112, the gate electrode 116, the source electrode 118, and the drain electrode 120 constitute an electric device 114 adjacent to the first side 106 of the substrate 102. In the embodiment, the electric device 114 is disposed at the first side 106 of the substrate 102, but the invention is not limited thereto. The electric device 114 can be disposed at the second side 108 of the substrate 102. Furthermore, in the embodiment, the electric device 114 is a nitride-based semiconductor device. However, the invention is not limited to a nitride-based semiconductor device. The invention can be applied to any semiconductor device, such as a silicon based device, III-V group device and/or SOI device.

Figure 1B:
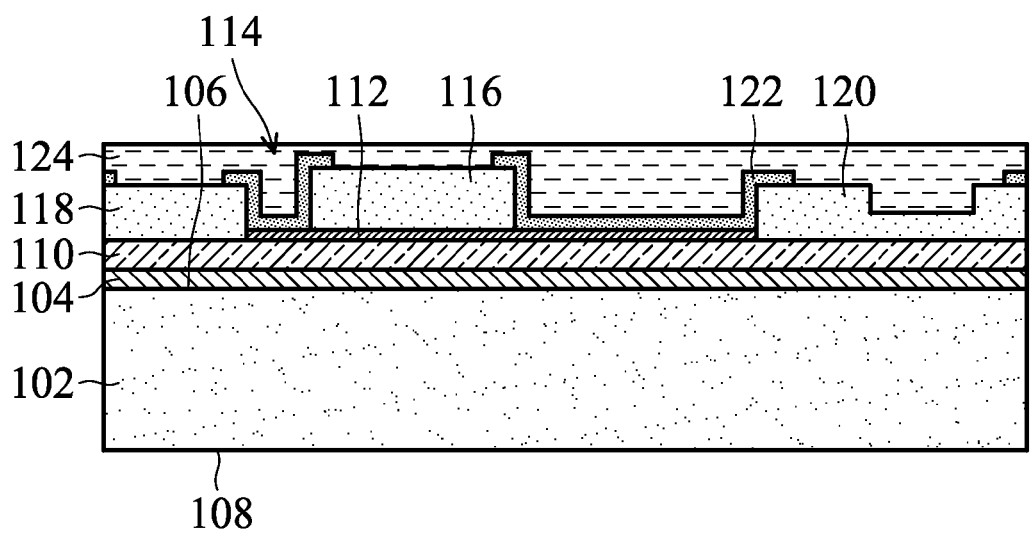
Figure 1C:
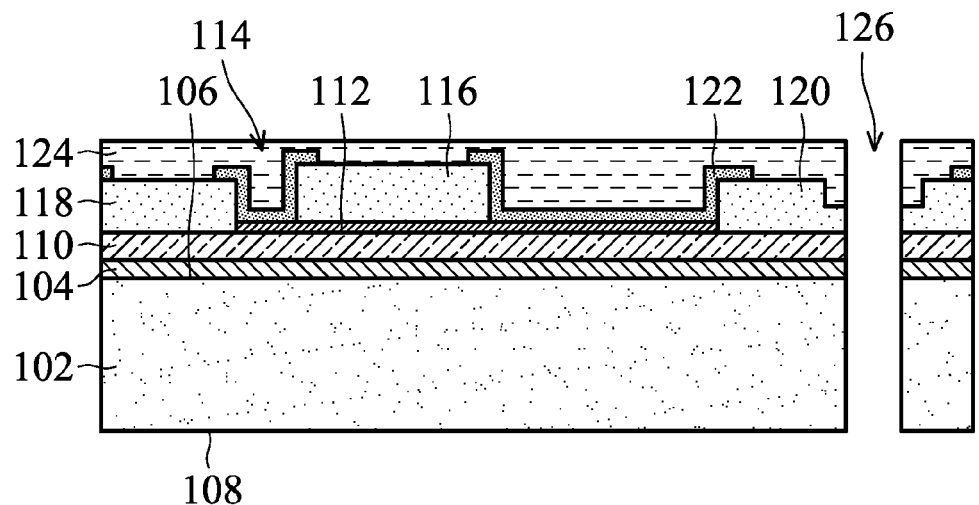

Next, referring to FIG. 1B, a photosensitive layer 124 is formed over the substrate 102 Thereafter, referring to FIG. 1C, the photosensitive layer 124 is patterned by a lithography process and the substrate 102 is further etched using the patterned photosensitive layer 124 as a mask to form a via hole 126 extending through the substrate 102. In an embodiment, the via hole 126 can be formed with drilling using a laser beam.

Figure 1D:
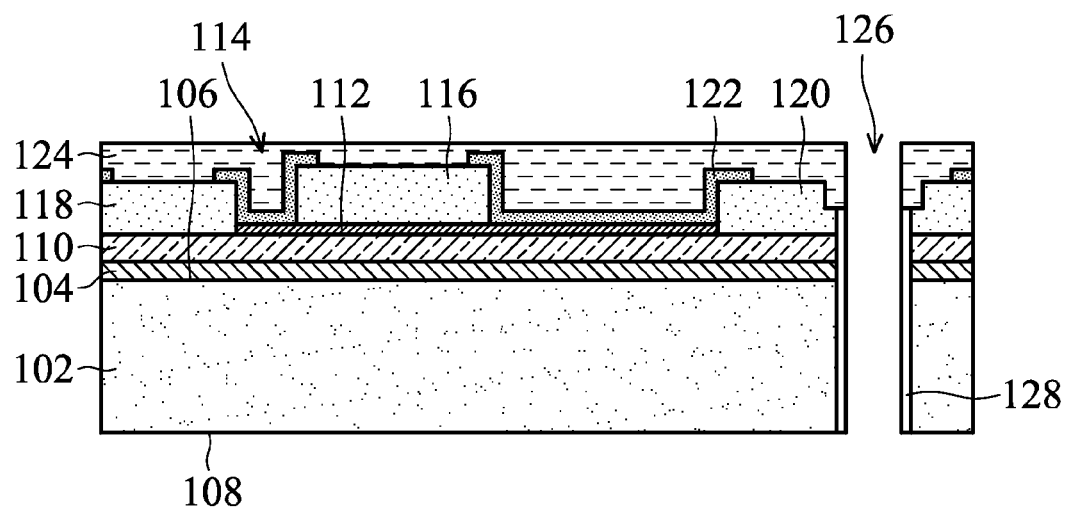
Figure 1E:
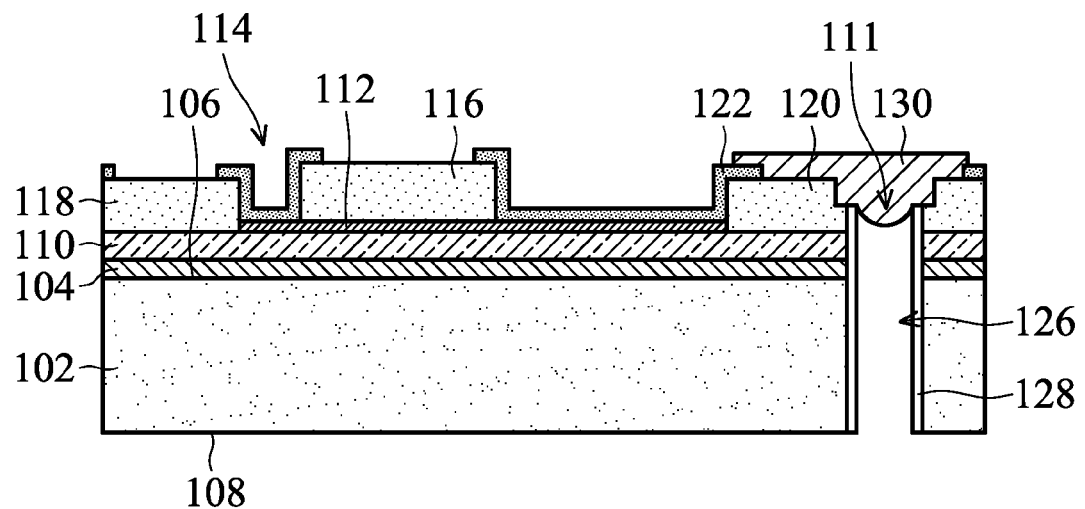
Figure 1F:
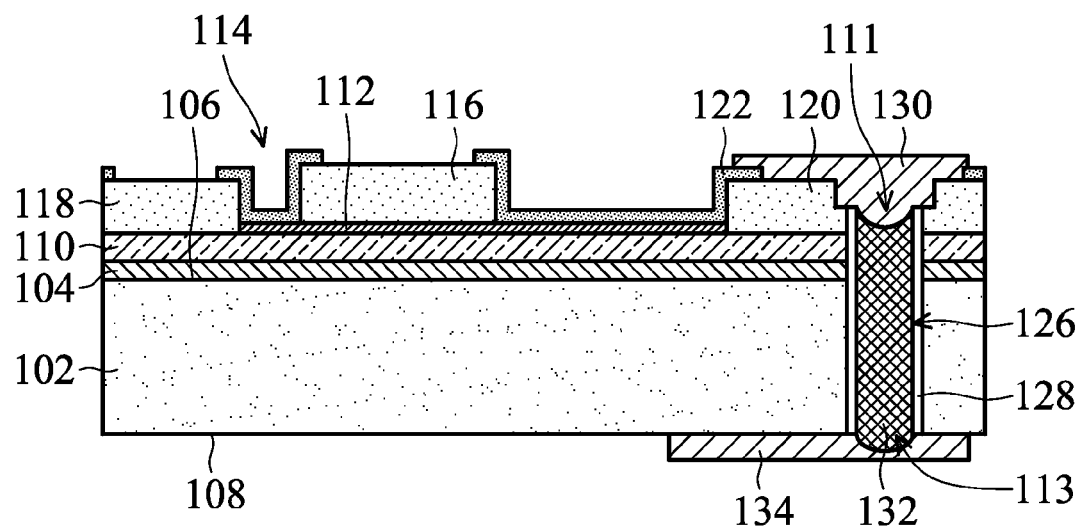

Referring to FIG. 1D, an insulating layer 128 is formed on the sidewall of the via hole 126 for protection. In an embodiment, the insulating layer 128 is silicon oxide and can be formed by thermal oxidation or liquid phase deposition (LPD). Referring to FIGS. 1E~1F, a first pad 130 is formed on the first side 106 of the substrate 102 and covers a first opening 111 of the via hole 126. The first pad 130 can electrically connect to the electrical device 114 and a second pad 134 formed in subsequent steps, and can comprise a protrusion portion extending into the via hole 126. In an embodiment, the first pad 130 can comprise silver paste and can be formed by screen printing. Referring to FIG. 1F, an electroplating process is performed using the first pad 130 as a seed layer to deposit a via structure 132 which fills the via hole 126. In an embodiment, the via structure 132 and the first pad 130 comprises the same material. In another embodiment, the via structure 132 and the first pad 130 comprises different materials. For example, the via structure 132 can comprise copper. As shown in FIG. 1F, since the via structure 132 is formed sequentially after forming the first pad 130, the via structure 132 does not exceed the first opening 111 of the via hole 126 neighboring the first side 106 of the substrate 102, but can exceed a second opening 113 of the via hole 126 neighboring the second side 108 of the substrate 102. Next, a second pad 134 is formed on the second side 108 of the substrate 102. In an embodiment, the second pad 134 can comprise silver paste and can be formed by screen printing. Though not shown in the figure, the invention can further comprise providing another semiconductor substrate which has another electric device thereto, wherein the other electric device electrically connects to the second pad.

In an embodiment of the invention, the electrical device 114 is a high electron mobility transistor (HEMT) and the substrate 102 comprises a conductive substrate. The source electrode 118 is electrically connected to the conductive substrate through the via structure 132.

Figure 2:
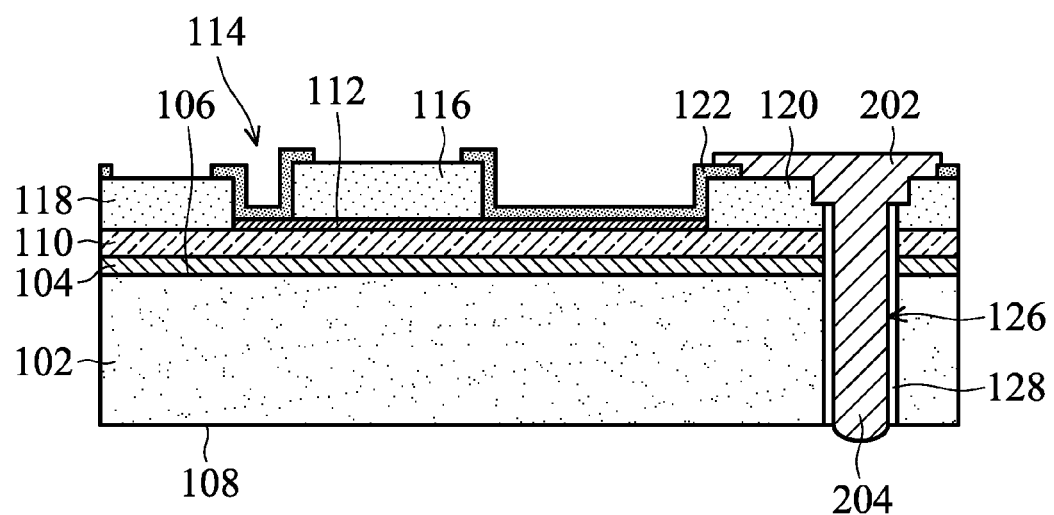
FIG. 2 show an intermediate stage of a cross section of a method for forming the interconnect structure of an embodiment of the invention.

A method for forming the interconnect structure of another embodiment of the invention is illustrated in accordance with FIG. 2. The embodiment of the method for forming the interconnect structure of FIG. 2 is similar to the method of FIGS. 1E~1F and for simplicity its detailed descriptions of similar steps are omitted. The method for forming the interconnect structure of FIG. 2 is different from the method for forming the interconnect structure of FIGS. 1E~1F in that the first pad 202 and the via structure 204 are formed by a single step. In the embodiment, when the through hole 126 depth is not great, for example the depth of the through hole is 20 µm to 50 µm, as shown in FIG. 2, the screen print for forming the first pad 202 can also fill the through hole 126, so that formation of the first pad 202 and the via structure 204 can be performed by a single screen printing step.

A method for forming the interconnect structure of yet another embodiment of the invention is illustrated in accordance with FIG. 3A to FIG. 3F. The method of the embodiment illustrated in FIG. 3A to FIG. 3F differs from the embodiment illustrated in FIG. 1A to FIG. 1F by the forming of the pad on the second side of the substrate opposite to the first side with the electric device prior to forming the via structure. First, referring to FIG. 3A, a substrate 302 comprising a first side 306 and a second side 308 is provided. The substrate 302 can be any suitable semiconductor material. For example, the substrate 302 can be Si, SiC, Ge, SiGe, GaAs, InAs, InP or GaN. Next, a buffer layer 304 is formed on the substrate 302. In an embodiment of the invention, the buffer layer 304 can be aluminum nitride. A first channel layer 310 and a second channel layer 312 are formed on the buffer layer 304. In an embodiment, the first channel layer 310 can be GaN and the second channel layer 312 can be AlGaN. Thereafter, a first metal layer (not shown) is formed on the first channel layer 310 and is then patterned by lithography and etching to form a source electrode 318 and a drain electrode 320. In an embodiment of the invention, the first metal layer is a stack of Ti, Al, Ni or Au layers. Furthermore, a rapid thermal annealing (RTA) process can be performed to the first metal layer. A second metal layer (not shown) is deposited and then patterned by lithography and etching to form a gate electrode 316. An passivation layer 322, such as silicon nitride and silicon oxide, is formed to protect the semiconductor device thereunder. The first channel layer 310, the second channel layer 312, the gate electrode 316, the source electrode 318, and the drain electrode 320 constitute an electric device 314 which is adjacent to the first side 306 of the substrate 302. In the embodiment, the electric device 314 is a nitride-based semiconductor device. However, the invention is not limited to being applied to a nitride-based semiconductor device. The invention can be applied to any semiconductor device, such as a silicon based device, III-V group device and/or SOI device.

Figure 3A:
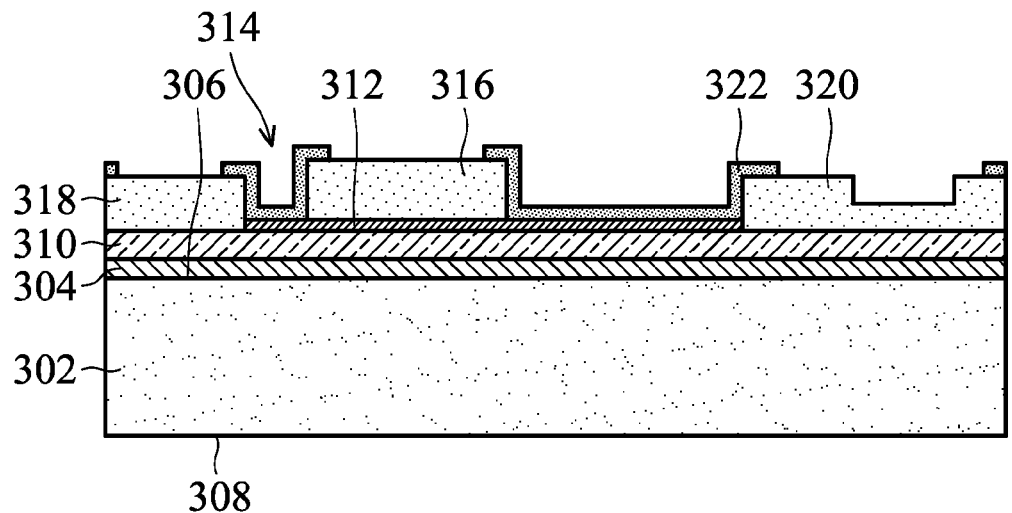
FIG. 3A to FIG. 3F show intermediate stages of cross sections of a method for forming the interconnect structure of an embodiment of the invention.
Figure 3B:
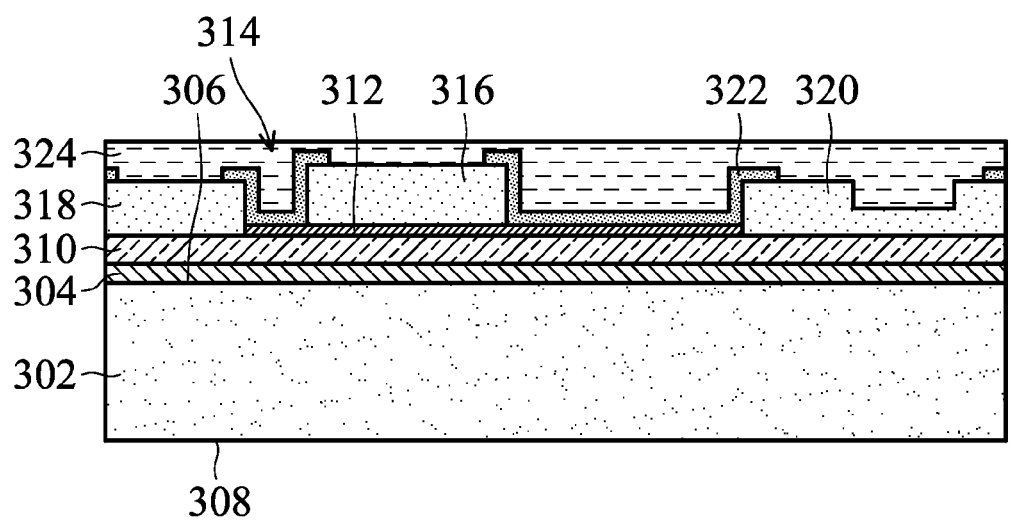
Figure 3C:
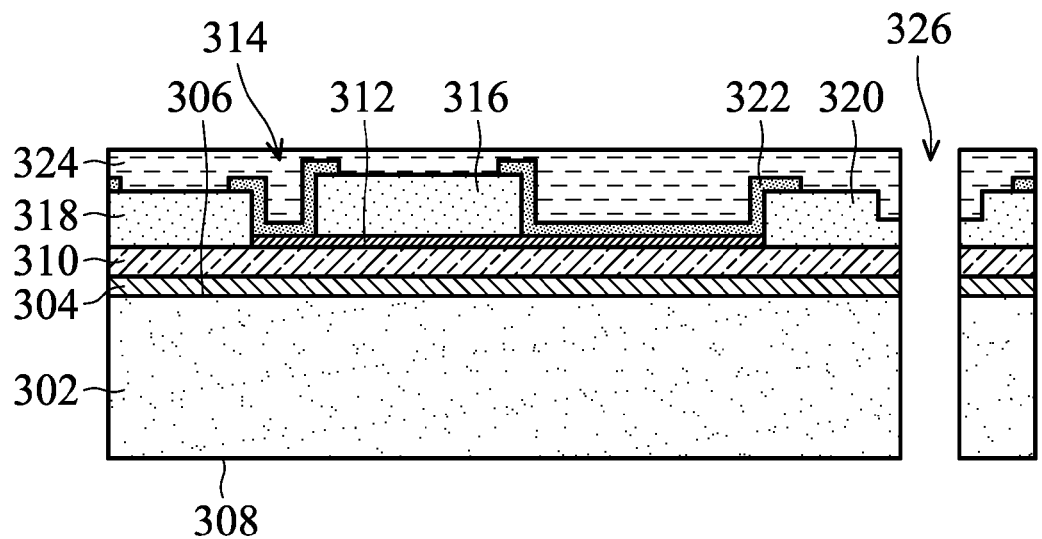

Next, referring to FIG. 3B, a photosensitive layer 324 is formed over the substrate 302 to protect the electric device 314. Thereafter, referring to FIG. 3C, the photosensitive layer 324 is patterned by a lithography process and the substrate 302 is further etched using the patterned photosensitive layer 324 as a mask to form a via hole 326 extending through the substrate 302 is formed. In an embodiment, the via hole 326 can be formed by a laser beam.

Figure 3D:
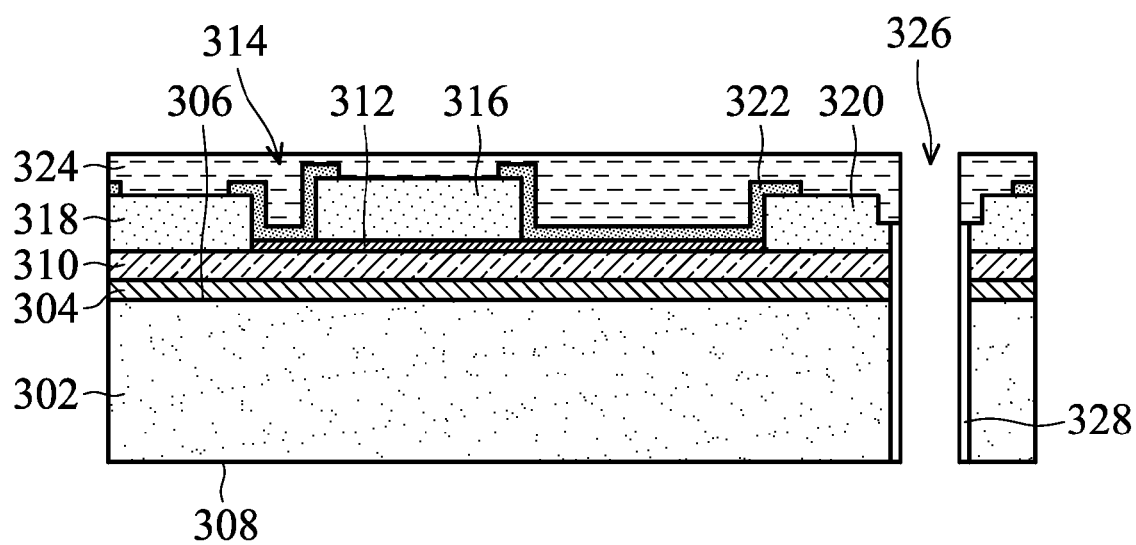
Figure 3E:
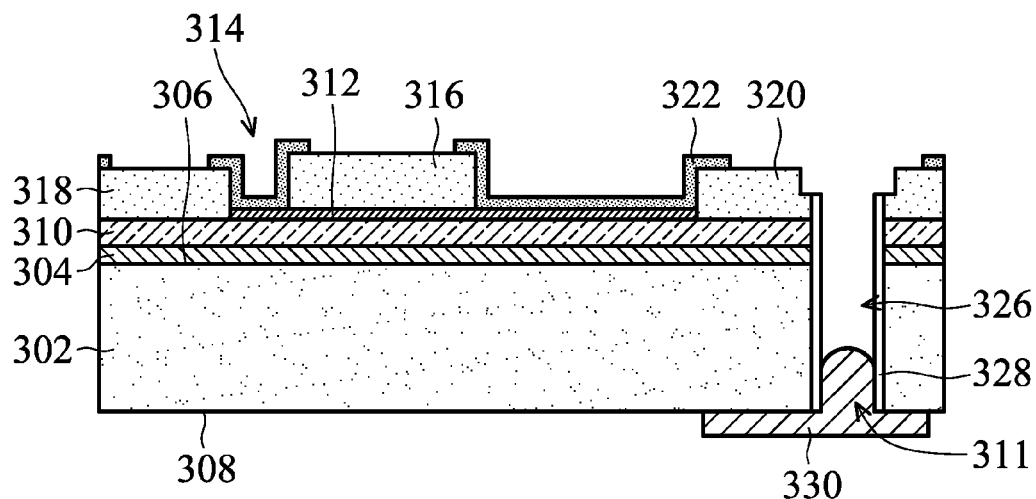
Figure 3F:
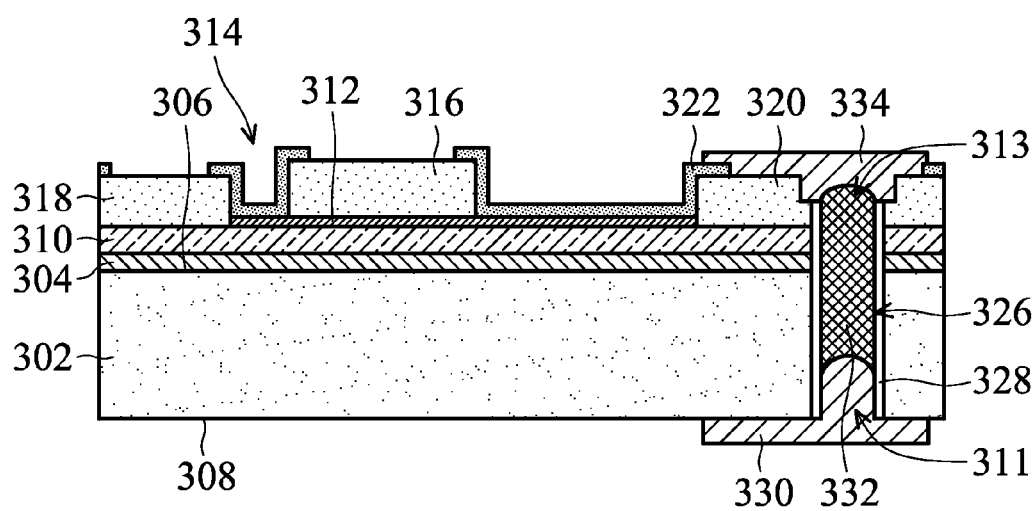
Figure 4A:
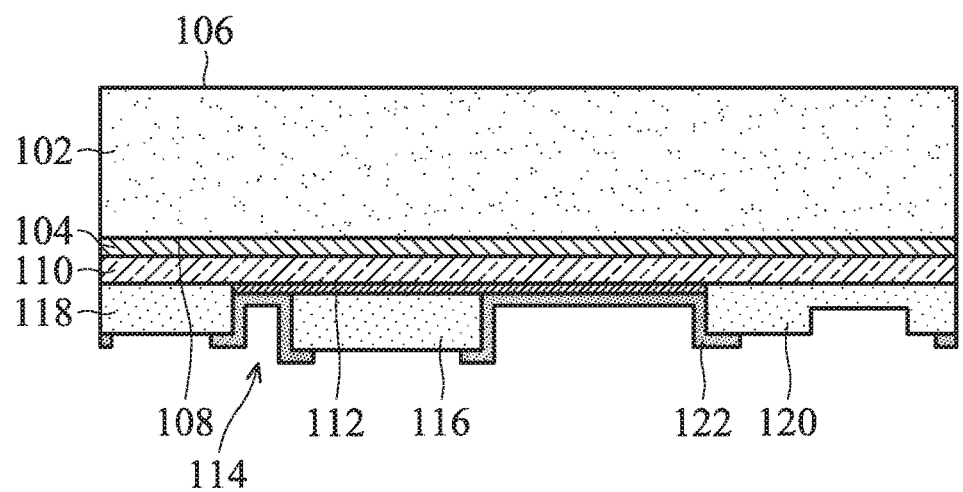
FIG. 4A to FIG. 4F show intermediate stages of cross sections of a method for forming the interconnect structure of an embodiment of the invention.
Figure 4B:
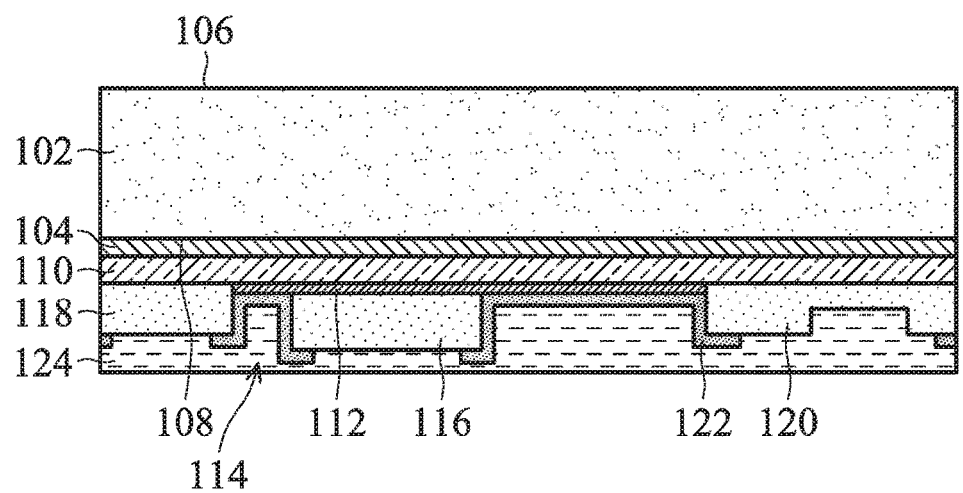
Figure 4C:
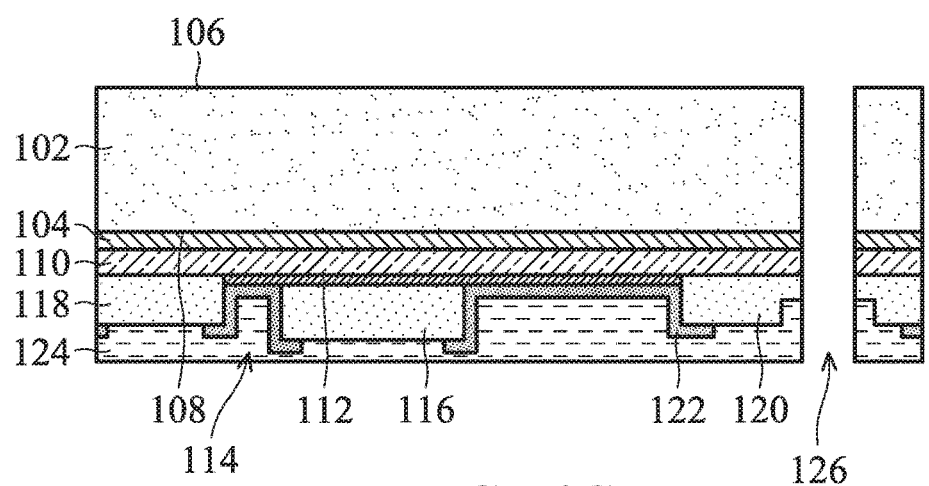
Figure 4D:
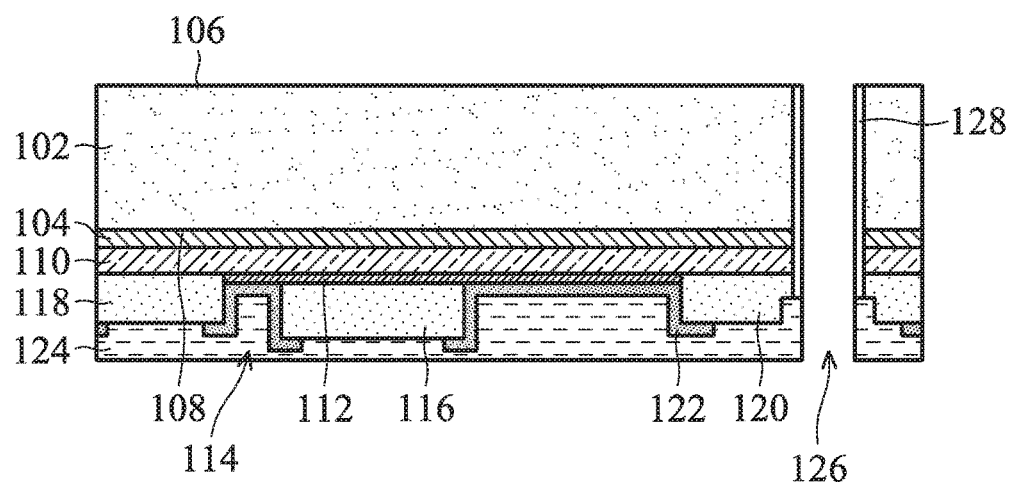
Figure 4E:
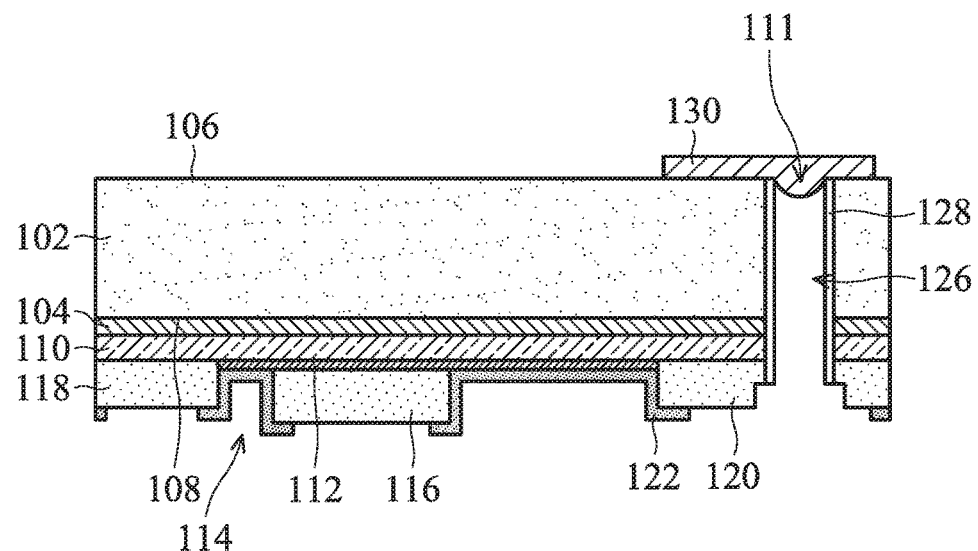
Figure 4F:
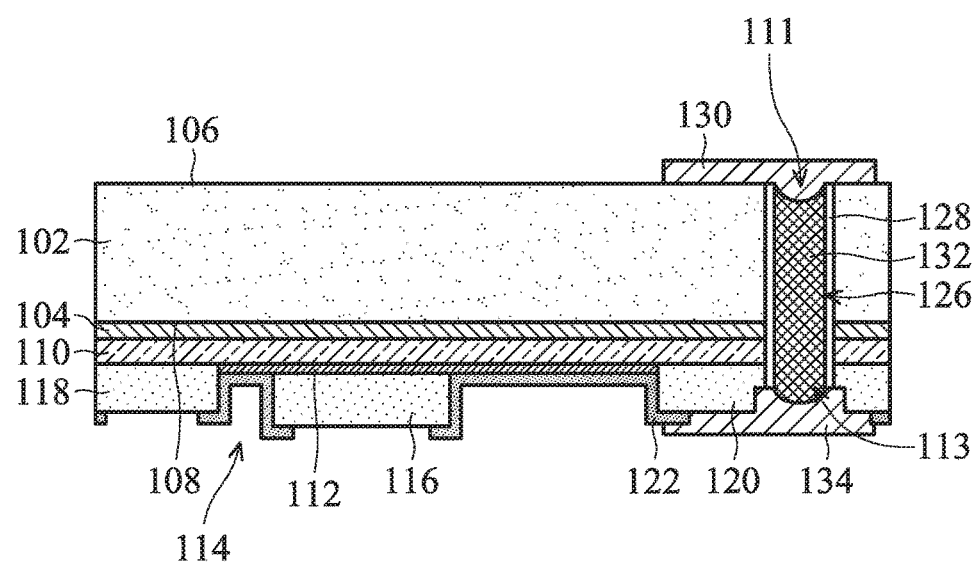

Referring to FIG. 3D, an insulating layer 328 is formed on the sidewall of the via hole 326 for protection. In an embodiment, the insulating layer 328 is silicon oxide and can be formed by thermal oxidation or liquid phase deposition (LPD). Referring to FIG. 3E, a first pad 330 is formed on the second side 308 of the substrate 302 and covers a second opening 311 of the via hole 326. In an embodiment, the first pad 330 can comprise silver paste and can be formed by screen printing. Referring to FIG. 3F, an electroplating process is performed using the first pad 330 as a seed layer to form a via structure 332 which fills the via hole 326. In an embodiment, the via structure 332 and the first pad 330 comprise the same material. In another embodiment, the via structure 332 and the first pad 330 comprise different materials. For example, the via structure 332 can comprise copper. As shown in FIG. 3F, since the via structure 332 is formed sequentially after forming the first pad 330, the via structure 332 does not exceed of the second opening 311 neighboring the second side 308 of the substrate 302, but can exceed a first opening 313 neighboring the first side 306 of the substrate 302. Next, a second pad 334, such as silver, is formed on the first side 306 of the substrate 302.

A method for forming the interconnect structure of yet another embodiment of the invention is illustrated in accordance with FIG. 4A to FIG. 4F. The method of the embodiment illustrated in FIG. 4A to FIG. 4F differs from the embodiment illustrated in FIG. 1A to FIG. 1F by forming the buffer layer 104, the electric device 114 (which is constituted by the first channel layer 110, the second channel layer 112, the gate electrode 116, the source electrode 118 and the drain electrode 120), the passivation layer 122 and the photosensitive layer 124 on the second side 108 of the substrate 102 opposite to the first side 106 of the substrate 302.

Figure 5:
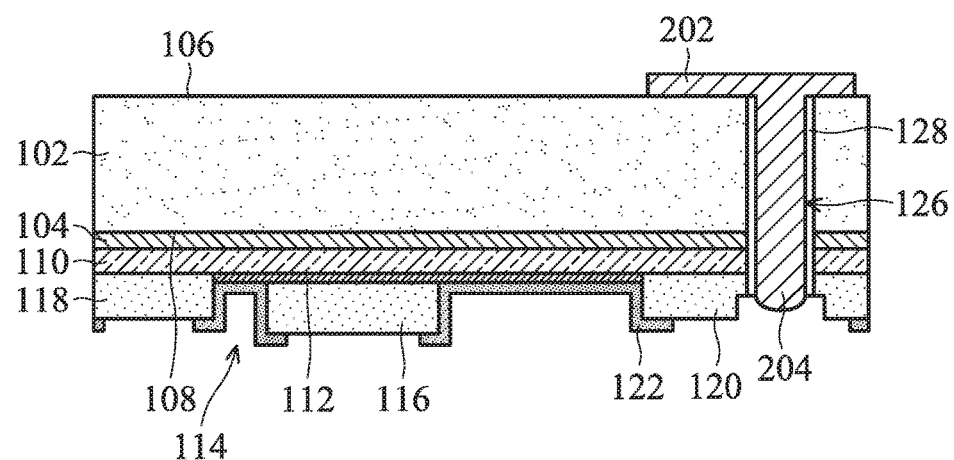
FIG. 5 show an intermediate stage of a cross section of a method for forming the interconnect structure of an embodiment of the invention.
Figure 6A:
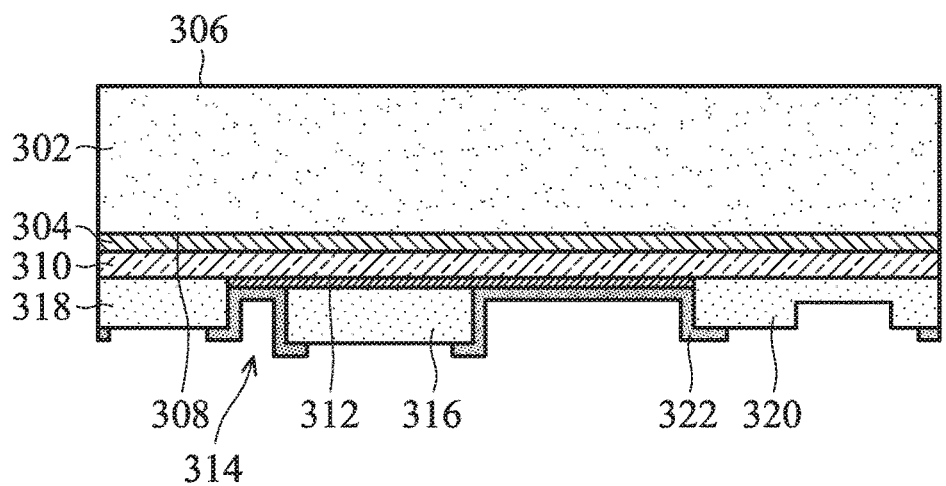
FIG. 6A to FIG. 6F show intermediate stages of cross sections of a method for forming the interconnect structure of an embodiment of the invention.
Figure 6B:
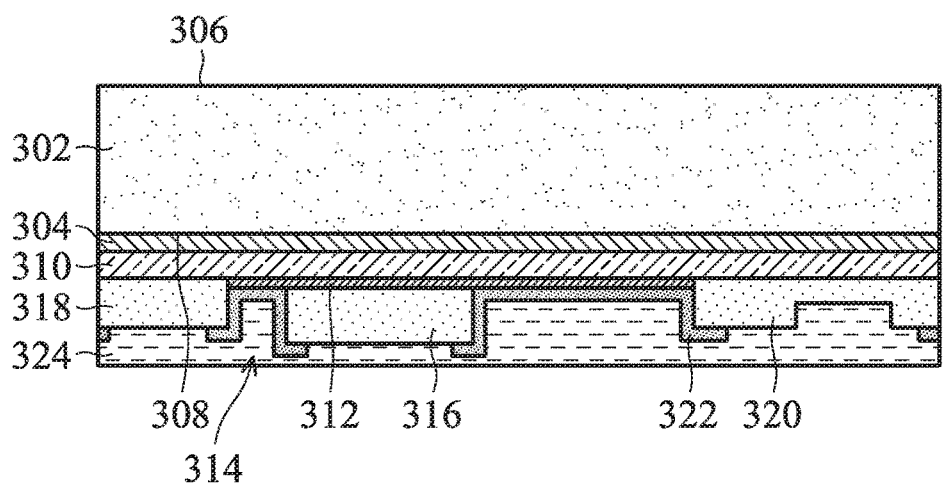
Figure 6C:
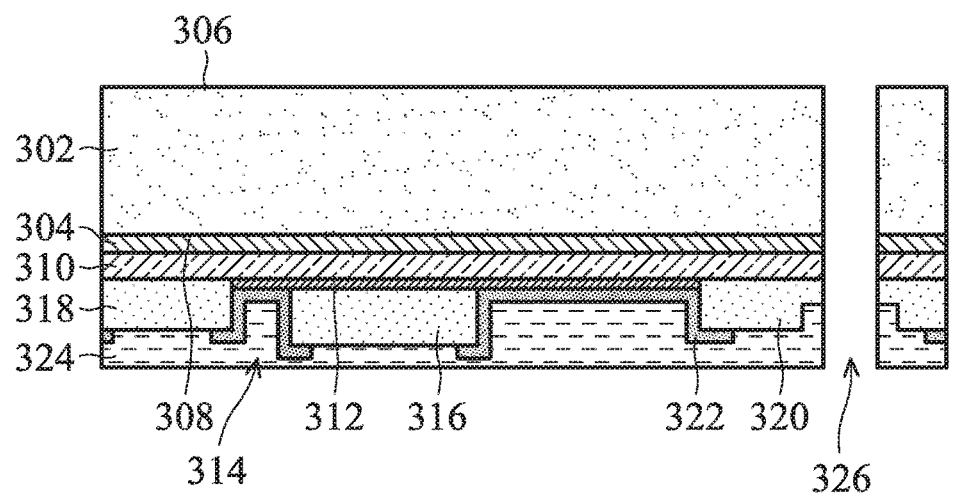
Figure 6D:
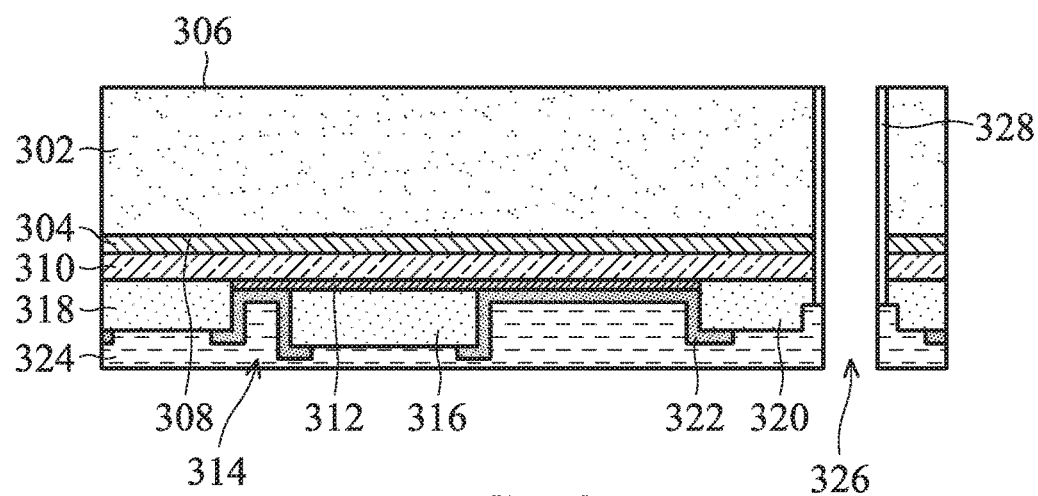
Figure 6E:
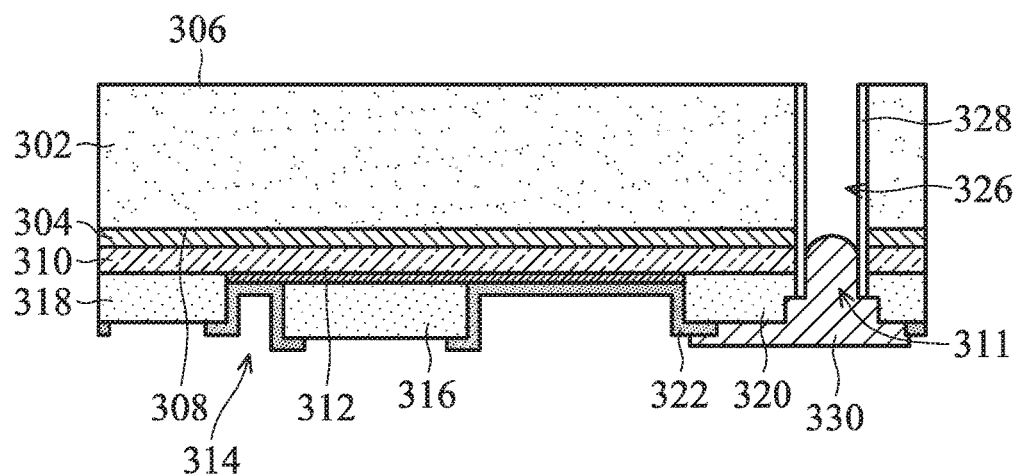
Figure 6F:
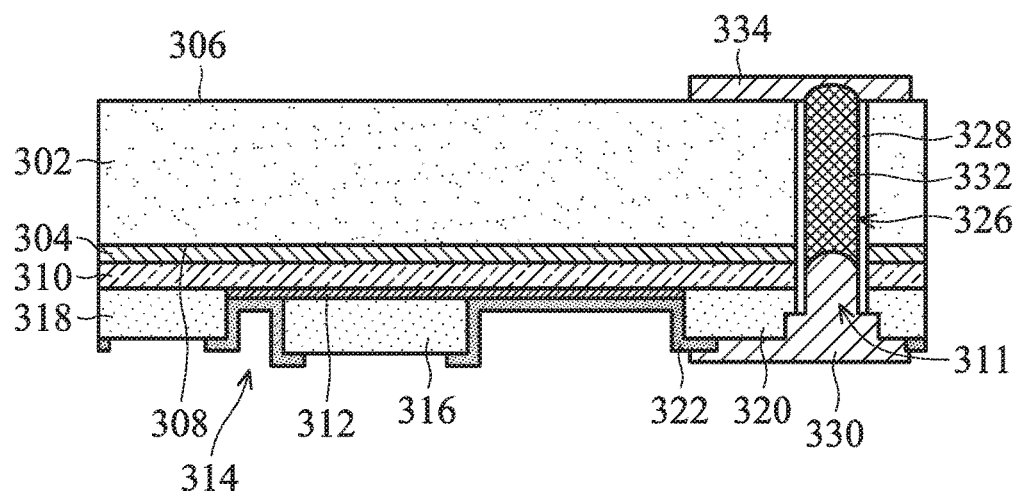

A method for forming the interconnect structure of yet another embodiment of the invention is illustrated in accordance with FIG. 5. The method of the embodiment illustrated in FIG. 5 differs from the embodiment illustrated in FIG. 2 by forming the buffer layer 104, the electric device 114 (which is constituted by the first channel layer 110, the second channel layer 112, the gate electrode 116, the source electrode 118 and the drain electrode 120), the passivation layer 122 and the photosensitive layer 124 on the second side 108 of the substrate 102 opposite to the first side 106 of the substrate 302.

A method for forming the interconnect structure of yet another embodiment of the invention is illustrated in accordance with FIG. 6A to FIG. 6F. The method of the embodiment illustrated in FIG. 6A to FIG. 6F differs from the embodiment illustrated in FIG. 3A to FIG. 3F by forming the buffer layer 304, the electric device 314 (which is constituted by the first channel layer 310, the second channel layer 312, the gate electrode 316, the source electrode 318 and the drain electrode 320), the passivation layer 322 and the photosensitive layer 324 on the second side 308 of the substrate 302 opposite to the first side 306 of the substrate 302.

The method for forming the interconnect structure of embodiments of the invention has advantages as follows. Since the method for forming the interconnect structure of the invention forms the via structure using electroplating with the first pad as a seed layer, no vacuum is required for forming the interconnect structure. Therefore, the method of the invention can produce semiconductor devices with lower costs.

While the invention has been described by way of example and in terms of the preferred embodiments, it is to be understood that the invention is not limited to the disclosed embodiments. It is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method of forming an interconnection structure comprising:
   providing a substrate having a first side and a second side opposite to the first side;
   forming at least one electric device on the substrate, wherein the at least one electric device comprises a plurality of metal electrodes;
   forming a via hole through one of the plurality of the metal electrodes of the electric device and the substrate, wherein the via hole has a first opening neighboring the first side and a second opening neighboring the second side;
   forming a first pad covering the first opening and directly on the at least one electric device, wherein a portion of the at least one electric device is between the first pad and the substrate; and
   forming a via structure in the via hole subsequent to forming the first pad, wherein the via structure comprises a conductive material and is adjoined to the first pad, and the via structure exceeds the second opening.

2. The method of forming an interconnection structure as claimed in claim 1, further comprising:
   forming a photosensitive layer on the substrate covering the at least one electric device prior to forming the via hole.

3. The method of forming an interconnection structure as claimed in claim 1, further comprising forming an insulating layer surrounding a sidewall of the via hole prior to forming the via structure.

4. The method of forming an interconnection structure as claimed in claim 1, wherein forming the first pad comprises performing a first metal screen printing process to form the first pad covering the first opening.

5. The method of forming an interconnection structure as claimed in claim 1, further comprising forming a second pad covering the via hole subsequent to forming the via structure.

6. The method of forming an interconnection structure as claimed in claim 1, wherein forming the via hole through the substrate comprises drilling the via hole through the substrate with a laser beam.

7. The method of forming an interconnection structure as claimed in claim 1, wherein forming the via structure is performed by electric plating using the first pad as a seed layer.

8. The method for forming an interconnection structure as claimed in claim 1, wherein the metal electrode of the electric device being through by the via hole is a drain electrode.

9. A method for forming an interconnection structure, comprising:
   providing a substrate having a first side a second side opposite to the first side;
   forming at least one electric device on the substrate, wherein the at least one electric device comprises a plurality of metal electrodes;

forming a via hole through one of the plurality of the metal electrodes of the electric device and the substrate, wherein the via hole has a first opening neighboring the first side and a second opening neighboring the second side; and performing a screen printing process on the first side to fill a conductive material into the via hole so as to form a via structure in the via hole and a first pad disposed on the first side and directly on the at least one electric device, adjoined to the via structure, and the via structure exceeds the second opening, wherein a portion of the at least one electric device is between the first pad and the substrate.

10. The method for forming an interconnection structure as claimed in claim 9, further comprising:

forming a photosensitive layer on the substrate covering the at least one electric device prior to forming the via hole.

11. The method for forming an interconnection structure as claimed in claim 9, further comprising forming an insulating layer surrounding a sidewall of the via hole prior to forming the via structure.

12. The method for forming an interconnection structure as claimed in claim 9, wherein the metal electrode of the electric device being through by the via hole is a drain electrode.

* * * * *